(12) United States Patent
Kim et al.

(10) Patent No.: US 9,136,313 B2
(45) Date of Patent: Sep. 15, 2015

(54) ORGANIC LIGHT-EMITTING DISPLAY APPARATUS AND METHOD FOR MANUFACTURING THE SAME

(71) Applicant: SAMSUNG DISPLAY CO., LTD., Yongin, Gyeonggi-Do (KR)

(72) Inventors: Dae-Woo Kim, Yongin (KR); Jong-Hyun Park, Yongin (KR); Chun-Gi You, Yongin (KR); Seong-Kweon Heo, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/287,997

(22) Filed: May 27, 2014

(65) Prior Publication Data

US 2015/0097160 A1    Apr. 9, 2015

(30) Foreign Application Priority Data

Oct. 7, 2013    (KR) .................. 10-2013-0119455

(51) Int. Cl.
*H01L 27/32* (2006.01)
*H01L 51/56* (2006.01)

(52) U.S. Cl.
CPC .......... *H01L 27/326* (2013.01); *H01L 27/3248* (2013.01); *H01L 51/56* (2013.01)

(58) Field of Classification Search
CPC .......... G02F 1/136213; G02F 2201/40; H01L 27/1255; H01L 27/3265; H01L 51/56
See application file for complete search history.

(56) References Cited

U.S. PATENT DOCUMENTS

| | | | |
|---|---|---|---|
| 8,390,751 B2 * | 3/2013 | Park et al. ................ | 349/38 |
| 2011/0042696 A1 | 2/2011 | Smith et al. | |
| 2011/0220879 A1 * | 9/2011 | Im et al. .................. | 257/40 |
| 2011/0297944 A1 | 12/2011 | Choi et al. | |
| 2013/0032803 A1 | 2/2013 | Moon et al. | |

FOREIGN PATENT DOCUMENTS

| | | |
|---|---|---|
| KR | 10-2005-0112034 A | 11/2005 |
| KR | 10-2007-0011008 A | 1/2007 |
| KR | 10-2011-0133925 A | 12/2011 |

* cited by examiner

*Primary Examiner* — Roy Potter
*Assistant Examiner* — Paul Patton
(74) *Attorney, Agent, or Firm* — Lee & Morse, P.C.

(57) ABSTRACT

An organic light-emitting display apparatus and a method for forming the same, the apparatus including a transparent protection layer on a substrate; a via insulation layer on the transparent protection layer; a pixel electrode on the via insulation layer; an opposite electrode on the pixel electrode; and an intermediate layer between the pixel electrode and the opposite electrode, the intermediate layer including an organic emission layer.

20 Claims, 7 Drawing Sheets

ORGANIC LIGHT-EMITTING DISPLAY APPARATUS AND METHOD FOR MANUFACTURING THE SAME

CROSS-REFERENCE TO RELATED APPLICATION

Korean Patent Application No. 10-2013-0119455, filed on Oct. 7, 2013, in the Korean Intellectual Property Office, and entitled: "Organic Light-Emitting Display Apparatus and Method For Manufacturing The Same," is incorporated by reference herein in its entirety.

BACKGROUND

1. Field

Embodiments relate to an organic light-emitting display apparatus and a method for manufacturing the same.

2. Description of the Related Art

Organic light-emitting display apparatuses are self-emitting display apparatuses that include an organic light-emitting device including a hole injection electrode, an electron injection electrode, and an organic emission layer between the hole injection electrode and the electron injection electrode. For example, holes injected from the hole injection electrode and electrons injected from the electron injection electrode may be recombined with each other within the organic emission layer to generate an exciton. Then, the exciton may drop from an excited state to a ground state to emit light.

The organic light-emitting display apparatuses that are the self-emitting display apparatuses may not require a separate light source, and the organic light-emitting display apparatuses may be operable at a low voltage and manufactured to be lightweight and compact. In addition, the organic light-emitting display apparatuses may have superior properties such as wide viewing angle, high contrast ratio, fast response time and the like, and the organic light-emitting display apparatuses are being expanded for a wide range of application from personal portable devices such as MP3 players or mobile phones to televisions.

SUMMARY

Embodiments are directed to an organic light-emitting display apparatus and a method for manufacturing the same.

The embodiments may be realized by providing an organic light-emitting display apparatus including a transparent protection layer on a substrate; a via insulation layer on the transparent protection layer; a pixel electrode on the via insulation layer; an opposite electrode on the pixel electrode; and an intermediate layer between the pixel electrode and the opposite electrode, the intermediate layer including an organic emission layer.

The organic light-emitting display apparatus may further include a pixel defining layer covering edges of the pixel electrode.

The transparent protection layer may have a width that is equal to or greater than a width of a region of the pixel electrode that is exposed by the pixel defining layer.

The via insulation layer may include a first region underlying a central portion of the pixel electrode and a second region underlying edges of the pixel electrode, and a distance between the substrate and a top surface of the first region may be less than a distance between the substrate and a top surface of the second region.

The first region of the via insulation layer may have a thickness of about 6 μm or less.

The via insulation layer may include an organic material.

The transparent protection layer may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may include a transflective metal layer, the transflective metal layer including silver or a silver alloy, and the opposite electrode may include a reflective metal layer.

The organic light-emitting display apparatus may further include a thin film transistor that is electrically connected to the pixel electrode, the thin film transistor including an active layer, a gate electrode, source and drain electrodes, a first insulation layer between the active layer and the gate electrode, and a second insulation layer between the gate electrode and the source and drain electrodes; and a pad electrode, the pad electrode including a first pad layer on a same layer as the source and drain electrodes, and a second pad layer on the first pad layer, wherein the via insulation layer covers the source and drain electrodes and edges of the pad electrode.

The transparent protection layer may be on the first insulation layer.

The transparent protection layer may be formed of a same material as the second pad layer.

The transparent protection layer may have a thickness of about 200 Å to about 800 Å.

The organic light-emitting display apparatus may further include a capacitor, the capacitor including a first electrode on a same layer as the active layer, a second electrode on a same layer as the gate electrode, and a third electrode on a same layer as the source and drain electrodes.

The via insulation layer may include a contact hole through which the pixel electrode is electrically connected to one of the source electrode and the drain electrode, the organic light-emitting display apparatus further includes a first contact layer under the contact hole, the first contact layer being electrically connected to one of the source electrode and the drain electrode, and a second contact layer on the first contact layer, the second contact layer including a same material as the second pad layer, a portion of the pixel electrode is within the contact hole, and the pixel electrode and the second contact layer are directly connected to each other.

The embodiments may be realized by providing a method for manufacturing an organic light-emitting display apparatus, the method including forming a transparent protection layer on a substrate; forming a via insulation layer on the transparent protection layer; forming a pixel electrode on the via insulation layer; forming an intermediate layer on the pixel electrode such that the intermediate layer includes an organic emission layer; and forming an opposite electrode on the intermediate layer.

The method may further include forming a pixel defining layer that covers edges of the pixel electrode, after forming the pixel electrode.

Forming the via insulation layer may include patterning an organic material by using a halftone mask after the organic material is formed on the transparent protection layer such that the via insulation layer includes a first region underlying a central portion of the pixel electrode and a second region underlying edges of the pixel electrode.

Forming the via insulation layer may include forming the via insulation layer such that the first region has a thickness of about 6 μm or less.

The method may further include forming and patterning a semiconductor layer on the substrate to form an active layer of a thin film transistor and a first electrode of a capacitor; successively forming a first insulation layer and a transparent conductive oxide layer and patterning the transparent conductive oxide layer to form a second electrode of the capacitor; forming and patterning a first metal layer to form a gate electrode of the thin film transistor; forming a second insulation layer on the first insulating layer; forming an opening in the second insulating layer and the first insulating layer such that the opening exposes a portion of the active layer; forming and patterning a second metal layer to form source and drain electrodes of the thin film transistor, a third electrode of the capacitor, and a first pad layer of a pad electrode; and forming and patterning a transparent conductive oxide layer to form a second pad layer on the first pad layer, wherein forming the transparent protection layer includes forming the transparent protection layer on the first insulation layer exposed by the opening, and forming the via insulation layer includes covering the source electrode, the drain electrode, the transparent protection layer, and edges of the second pad layer.

Forming the transparent protection layer may be performed by a same process as the forming of the second pad layer.

BRIEF DESCRIPTION OF THE DRAWINGS

Features will be apparent to those of ordinary skill in the art by describing in detail exemplary embodiments with reference to the attached drawings in which.

DETAILED DESCRIPTION

Figure 1:
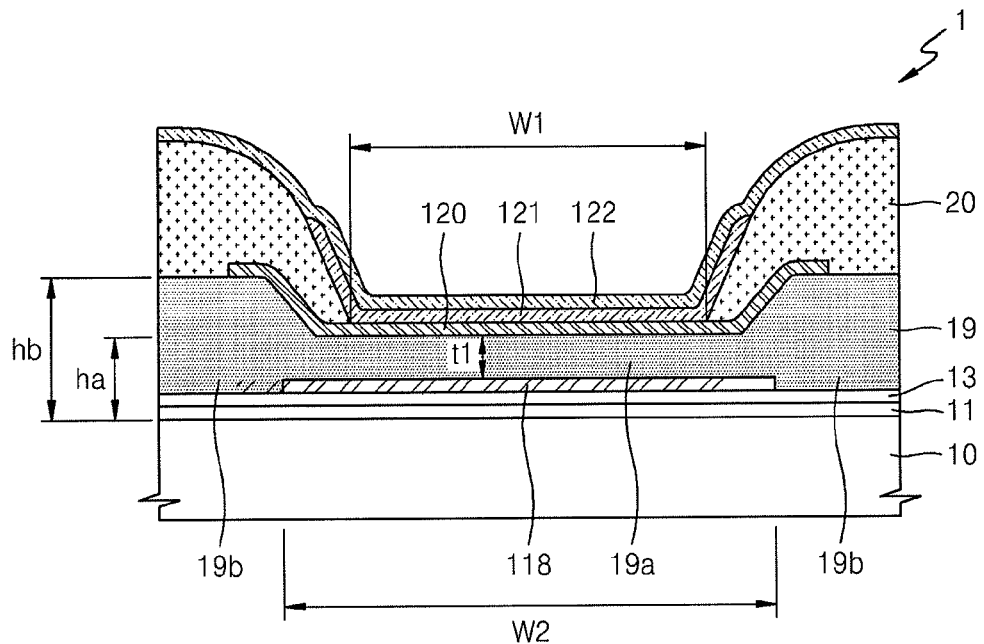
FIG. 1 illustrates a schematic cross-sectional view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may be present.

FIG. 1 illustrates a schematic cross-sectional view of an organic light-emitting display apparatus according to an embodiment.

Referring to FIG. 1, an organic light-emitting display apparatus 1 according to an embodiment may include a transparent protection layer 118 on a substrate 10, a via insulation layer 19 on the transparent protection layer 118, a pixel electrode 120 on the via insulation layer 19, an intermediate layer 121 on the pixel electrode 120, and an opposite electrode 122 on the intermediate layer 121. The intermediate layer 121 may include an organic emission layer.

A pixel defining layer 20 may cover edges, e.g., both edges, of the pixel electrode 120, and may be on the via insulation layer 19. The pixel defining layer 20 may define a pixel region, e.g., a region in or from which light is emitted to the outside.

An insulation layer, e.g., a buffer layer 11 and/or a first insulation layer 13, may be between the substrate 10 and the pixel electrode 120. In an implementation, the insulation layer may be omitted.

The pixel electrode 120 may include a transparent or semi-transparent electrode that transmits light emitted from the organic emission layer of the intermediate layer 121. The pixel electrode 120 may be formed of or may include a transparent conductive oxide, e.g., indium tin oxide (ITO), indium zinc oxide (IZO), zinc oxide (ZnO), indium oxide ($In_2O_3$), indium gallium oxide (IGO), or aluminum zinc oxide (AZO).

In an implementation, the pixel electrode 120 may further include a transflective metal layer, in addition to the above-described transparent conductive oxide. The transflective metal layer may be formed of or may include, e.g., silver (Ag) or a silver alloy, and may include a thin film having a thickness of about 100 Å to about 300 Å.

The pixel electrode 120 may have a structure in which the transparent electrode, the transflective metal layer, and the transparent electrode are successively or sequentially stacked on each other.

The intermediate layer 121 may include the organic emission layer. In an implementation, the intermediate layer 121 may further include at least one of a hole injection layer (HIL), a hole transport layer (HTL), an electron transport layer (ETL), and an electron injection layer (EIL). In an implementation, the intermediate layer 121 may include the organic emission layer and may further include various functional layers.

The organic emission layer of the intermediate layer 121 may include an organic material that emits red, green, or blue light. In an implementation, the organic emission layer may emit white light. In this case, the organic emission layer may have a structure in which a light emitting material for emitting red light, a light emitting material for emitting green light, and a light emitting material for emitting blue light are stacked on each other. In an implementation, the organic emission layer may have a structure in which the light emitting material for emitting the red light, the light emitting material for emitting the green light, and the light emitting material for emitting the blue light are mixed with each other.

In an implementation, if the white light is emitted, combinations of various colors, in addition to the combinations of the red, green, and blue colors, may be used.

The opposite electrode 122 may include a reflective metal layer. In an implementation, the opposite electrode 122 may be formed of or include, e.g., Al, Mg, Li, Ca, LiF/Ca, or LiF/Al.

For example, the organic light-emitting display apparatus 1 may be a bottom emission type display apparatus in which light emitted from the intermediate layer 121 is reflected by the opposite electrode 122 and transmitted through the pixel electrode 120 so as to be emitted in a direction of the substrate 10.

When the pixel electrode 120 includes the transflective metal layer, the transflective metal layer, together with the opposite electrode 122, may form a microcavity to help improve optical efficiency and color purity.

The transparent protection layer 118 and the via insulation layer 19 may be between the first insulation layer 13 and the pixel electrode 120. The transparent protection layer 118 may include a transparent conductive oxide, e.g., indium tin oxide (ITO), indium zinc oxide (IZO), zinc oxide (ZnO), indium oxide ($In_2O_3$), indium gallium oxide (IGO), or aluminum zinc oxide (AZO).

The transflective metal layer of the pixel electrode 120 may be formed of or may include silver (Ag). The silver (Ag) may react with a material in the first insulation layer 13 that is under the transparent protection layer 118. In an implementation, a transparent layer or electrode may be additionally disposed on upper and lower portions or sides of the transflective metal layer. Silver (Ag) from the transflective metal layer could penetrate the transparent layer because the transparent electrode may have a thin thickness.

For example, silver (Ag) that penetrates the transparent layer or electrode and that is diffused into the first insulation layer may cause a dark spot defect. However, the organic light-emitting display apparatus 1 according to the current embodiment may include the transparent protection layer 118 between the pixel electrode 120 and the first insulation layer 13 to block a diffusion path of the silver (Ag), thereby reducing and/or preventing occurrence of the dark spot (caused by the diffusion of silver (Ag)).

In an implementation, the transparent protection layer 118 may have a width W2 that is equal to, e.g., about equal to, or greater than a width W1 of an area of the pixel electrode 120 that is exposed by the pixel defining layer 20 (e.g., a region of the pixel electrode 120 that the pixel defining layer does not overlie or cover). For example, an area of the pixel electrode 120 that is not covered by the pixel defining layer 20 may be short-circuited with the opposite electrode 122 to help prevent the dark spot from occurring.

In an implementation, the transparent protection layer 118 may planarize the substrate 10, the buffer layer 11, and the first insulation layer 13 (e.g., elements that may be under the transparent protection layer 118).

The via insulation layer 19 may include an organic material to help reduce the likelihood of and/or prevent the dark spot from occurring when the buffer layer 11, the first insulation layer 13, and the transparent protection layer 118 (which are under the via insulation layer 19) are formed or due to particles generated on a boundary between the layers.

Each of the buffer layer 11 and the first insulation layer 13 may include an inorganic material. In an implementation, the buffer layer 11 and the first insulation layer 13 may be formed by using a chemical vapor deposition process. Projections may be generated by particles due to a deposition device in the chemical deposition process and materials for forming the buffer layer 11 and the first insulation layer 13.

Particles, each having a predetermined size, may be introduced between the layers due to various environmental factors. As a result, cracks in the transparent electrode that protects the transflective metal layer of the pixel electrode 120 may occur by stepped portions due to the particles.

For example, if cracks were to occur in the transparent electrode on the transflective metal layer, oxygen could be introduced through the cracks to react with the silver (Ag), thereby generating projections or impurities, e.g., $Ag_2O$. Thus, the pixel electrode 120 and the opposite electrode 122 may be short-circuited with each other by or through the projections or impurities, thereby causing a corresponding pixel to fail to emit light.

The via insulation layer 19 of the organic light-emitting display apparatus 1 according to the current embodiment may cover the particles that cause the dark spot, thereby performing a planarization function. As a result, the occurrence of the dark spot may be reduced and/or prevented.

As described above, the organic light-emitting display device 1 may be a bottom emission type display device, and the via insulation layer 19 may be formed of or may include polyimide (PI), through which light is capable of being transmitted.

The via insulation layer 19 according to the current embodiment may include a first region 19a (corresponding to or underlying a central portion of the pixel electrode 120) and a second region 19b (corresponding to or underlying an edge portion of the pixel electrode 120). A distance (ha) between the substrate 10 and a top surface of the first region 19a may be less than a distance (hb) between the substrate 19b and a top surface of the second region 19b. For example, an etching surface may be between the first region 19a and the second region 19b. The via insulation layer 19 according to the current embodiment may be formed by patterning the organic material by using a halftone mask.

The first region 19a may correspond to or underlie a region in which a corresponding pixel emits light. In an implementation, the first region 19a may have a thickness t1 of about 6 μm or less. Maintaining the thickness t1 of the first region 19a at about 6 μm or less may help ensure that light emitted from the intermediate layer 121 in the direction of the substrate 10 is not lost, thereby helping to prevent a reduction in optical efficiency.

Figure 2:
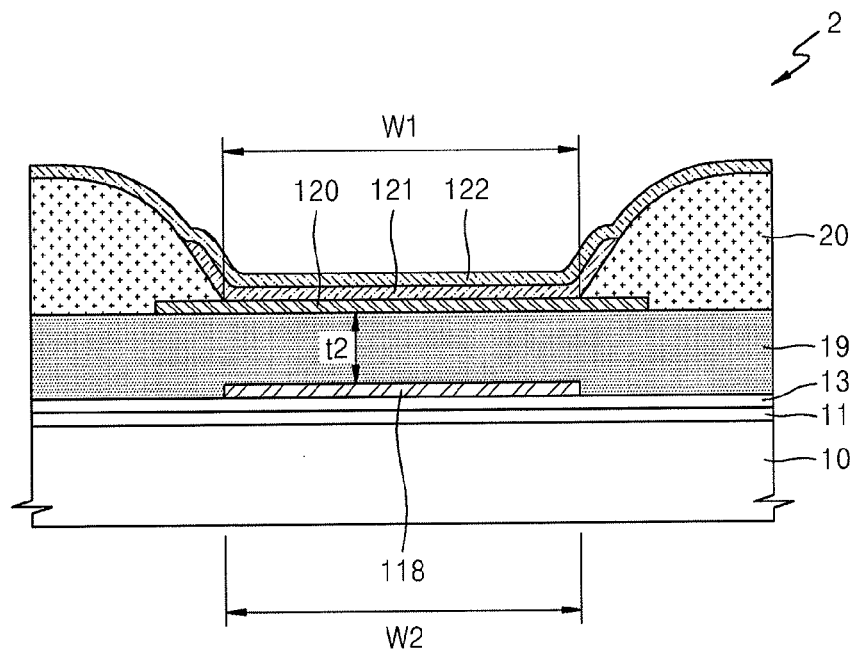
FIG. 2 illustrates a schematic cross-sectional view of an organic light-emitting display apparatus according to another embodiment.

FIG. 2 illustrates a schematic cross-sectional view of an organic light-emitting display apparatus according to another embodiment.

Referring to FIG. 2, an organic light-emitting display apparatus 2 according to an embodiment may include a transparent protection layer 118 on a substrate 10, a via insulation layer 19 on the transparent protection layer 118, a pixel electrode 120 on the via insulation layer 19, an intermediate layer 121 on the pixel electrode 120 (the intermediate layer 121 including an organic emission layer), and an opposite electrode 122 on the intermediate layer 121.

A pixel defining layer 20 covering edges, e.g., both edges, of the pixel electrode 120 may be on the via insulation layer 19. An insulation layer including, e.g., a buffer layer 11 and/or a first insulation layer 13, may be between the substrate 10 and the pixel electrode 120.

The pixel electrode 120 may include a transflective metal layer including, e.g., silver (Ag) or a silver alloy. The transparent protection layer 118 may include, e.g., a transparent conductive oxide, and the via insulation layer 19 may include, e.g., an organic material.

The transparent protection layer 118 and the via insulation layer 19 may help reduce the occurrence of undesirable dark spots in the organic light-emitting display apparatus 2.

The transparent protection layer 118 may have a width W2 that is equal to or greater than a width W1 of a region of the pixel electrode 120 that is exposed by the pixel defining layer 20.

Unlike the organic light-emitting display apparatus of FIG. 1, the via insulation layer 19 of the present embodiment may not include a region that has a different height, e.g., an etching surface. Thus, a patterning process for forming the via insulation layer 19 may be omitted.

The via insulation layer 19 may have a thickness t2 of about 6 μm or less. Maintaining the thickness t2 of the via insulation layer 19 at about 6 μm or less may help ensure that light emitted from the intermediate layer 121 in a direction of the substrate 10 is not lost, thereby ensuring sufficient optical efficiency.

Other components may be the same as those of the organic light-emitting display apparatus 1 of FIG. 1, and repeated detailed descriptions may be omitted.

Figure 3:
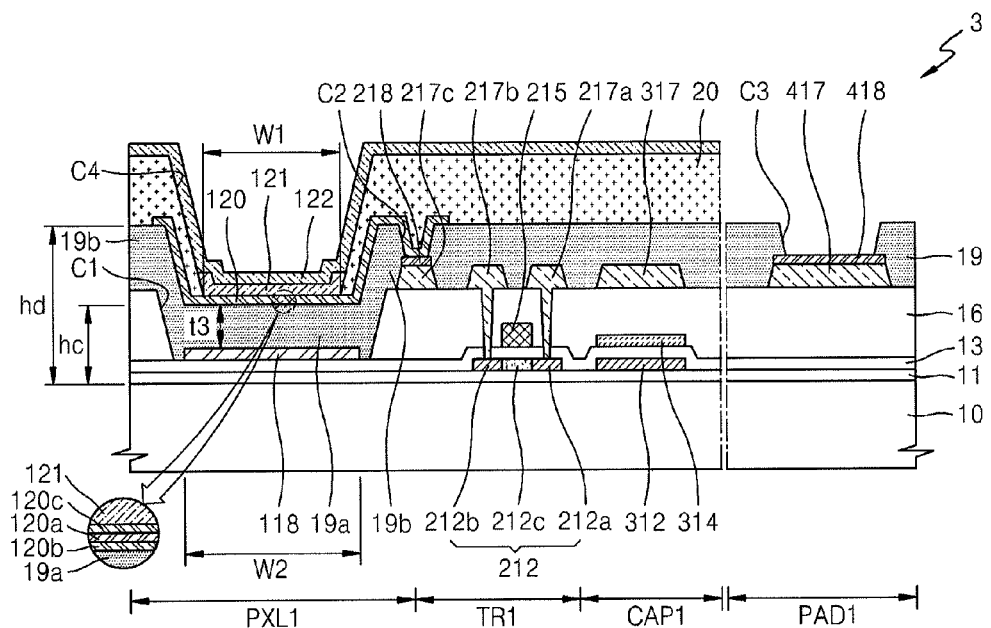
FIG. 3 illustrates a schematic cross-sectional view of an organic light-emitting display apparatus according to another embodiment.

FIG. 3 illustrates a schematic cross-sectional view of an organic light-emitting display apparatus according to another embodiment.

Referring to FIG. 3, an organic light-emitting display apparatus 3 according to the current embodiment may include a pixel region PXL1 that includes an intermediate layer 121 (including an organic emission layer) on a substrate 10, a transistor region TR1 that includes at least one thin film transistor, a capacitor region CAP1 that includes at least one capacitor, and a pad region PAD1.

The substrate 10 may be a glass substrate or transparent plastic substrate. In an implementation, a buffer layer 11 may be on the substrate 10.

An active layer 212 of a thin film transistor may be on the buffer layer 11 in the transistor region TR1. The active layer 212 may contain various materials. For example, the active layer 212 may contain an inorganic semiconductor material such as amorphous silicon or crystalline silicon. The active layer 212 may include a channel region 212c and source and drain regions 212a and 212b at edges, e.g., both edges, of the channel region 212c and doped with ion impurities. In an implementation, the active layer 212 may include an oxide semiconductor. In an implementation, the active layer 212 may include an organic semiconductor material.

A gate electrode 215 may be on a first insulation layer 13 at a position corresponding to or overlying the channel region 212c of the active layer 212. The first insulation layer 13 (e.g., a gate insulation layer) may be between the active layer 212 and the gate electrode 215. For example, the gate electrode 215 may be formed of or may include at least one metal selected from aluminum (Al), platinum (Pt), palladium (Pd), silver (Ag), gold (Au), nickel (Ni), neodymium (Nd), iridium (Ir), chromium (Cr), lithium (Li), molybdenum (Mo), titanium (Ti), tungsten (W), or copper (Cu), in a single or multilayer configuration.

A source electrode 217a and a drain electrode 217b (contacting the source region 212a and the drain region 212b of the active layer 212) may be on a second insulation layer 16. The second insulation layer 16 (e.g., an interlayer dielectric) may be between the gate electrode 215 and the source electrode 217a and the drain electrode 217b. The source and drain electrodes 217a and 217b may have a structure in which different kinds of metal layers having electron mobilities different from each other are formed in two layers or more. For example, the source and drain electrodes 217a and 217b may have a structure in which metals selected from aluminum (Al), platinum (Pt), palladium (Pd), silver (Ag), gold (Au), nickel (Ni), neodymium (Nd), iridium (Ir), chromium (Cr), lithium (Li), molybdenum (Mo), titanium (Ti), tungsten (W), copper (Cu), or alloys thereof are formed in two layers or more.

A via insulation layer 19 may be on the second insulation layer to cover the source and drain electrodes 217a and 217b.

Each of the first and second insulation layer 13 and 16 may be provided as a single layer or a plurality of inorganic insulation layers. The via insulation layer 19 may include an organic material.

A pixel defining layer 20 may be on the via insulation layer 19. The pixel defining layer 20 may include an organic material.

The buffer layer 11 and the first insulation layer 13 may be on the substrate 10 in the pixel region PXL1. Also, a transparent protection layer 118, the via insulation layer 19, a pixel electrode 120, the intermediate layer 121 (including the organic emission layer), and the opposite electrode 122 may be successively on the first insulation layer 13 in the pixel region PXL1.

The pixel defining layer 20 covering the edges, e.g., both edges, of the pixel electrode 120 may be on the via insulation layer 19.

The pixel electrode 120 may include a transflective metal layer 120a. Transparent electrodes 120b and 120c protecting the transflective metal layer 120a may be on lower and upper portions of the transflective metal layer 120a, respectively. The transflective metal layers 120a may include, e.g., silver (Ag) or a silver alloy.

Each of the transparent electrodes 120b and 120c may include at least one transparent conductive oxide selected from the group of, e.g., indium tin oxide (ITO), indium zinc oxide (IZO), zinc oxide (ZnO), indium oxide ($In_2O_3$), indium gallium oxide (IGO), and aluminum zinc oxide (AZO).

The intermediate layer 121 may include the organic emission layer. In an implementation, the intermediate layer 121 may further include at least one of a hole injection layer (HIL), a hole transport layer (HTL), an electron transport layer (ETL), or an electron injection layer (EIL). In an implementation, the intermediate layer 121 may include the organic emission layer and further include various functional layers.

The opposite electrode 122 may include a reflective metal layer. The opposite electrode 122 may be formed of or may include, e.g., at least one of Al, Mg, Li, Ca, LiF/Ca, or LiF/Al.

The opposite electrode 122 (together with the transflective metal layer 120a of the pixel electrode 120) may form a microcavity to help improve optical efficiency and color purity in the organic light-emitting display apparatus 3.

Thus, the organic light-emitting display device 3 according to the current embodiment may be a bottom emission type display device in which light emitted from the intermediate layer 121 is reflected by the opposite electrode 122 and transmitted through the pixel electrode 120 so as to be emitted in a direction of the substrate 10.

The transparent protection layer 118 and the via insulation layer 19 may be between the first insulation layer and the pixel electrode 120. The transparent protection layer 118 may include at least one transparent conductive oxide, e.g., indium tin oxide (ITO), indium zinc oxide (IZO), zinc oxide (ZnO), indium oxide ($In_2O_3$), indium gallium oxide (IGO), or aluminum zinc oxide (AZO).

The transparent protection layer 118 may be within an opening C1 in the second insulation layer 16. The transparent protection layer 118 may have a width W2 that is equal to or greater than a width W1 of a region of the pixel electrode 120 that is exposed by the pixel defining layer 20.

The transparent protection layer 118 may have a thickness of about 200 Å to about 800 Å. The transparent protection layer 118 may help block a diffusion path of the silver (Ag) in the pixel electrode 120 to help reduce the occurrence of undesirable dark spots.

The via insulation layer 19 may include an organic material through which light is transmittable to help reduce the occurrence the dark spots when the buffer layer 11, the first insulation layer 13, and the transparent protection layer 118 (which are disposed the via insulation layer 19) are formed, or due to particles generated on a boundary between the layers.

The via insulation layer 19 according to the current embodiment may include a first region 19a corresponding to or underlying a central portion of the pixel electrode 120 and a second region 19b corresponding to or underlying an edge portion of the pixel electrode 120. A distance (hc) between the substrate 10 and a top surface of the first region 19a may be less than a distance (hd) between the substrate 19b and a top surface of the second region 19b. For example, an etching surface may be between the first region 19a and the second region 19b. The via insulation layer 19 according to the current embodiment may be formed by patterning the organic material by using a halftone mask. The patterning process may be performed with a process of forming a contact hole C2 in the via insulation layer 19 and an opening C3 for exposing a second pad layer 418 at the same time.

The first region 19a may correspond to a region in which a corresponding pixel emits light. The first region 19a may have a thickness t3 of about 6 μm or less. Maintaining the thickness t3 of the first region 19a at about 6 μm or less may help ensure that light emitted from the intermediate layer 121 in the direction of the substrate 10 is not lost, thereby helping to prevent a reduction in optical efficiency.

The pixel electrode 120 may be on the via insulation layer 19 along the etching surface of the via insulation layer 19. The pixel defining layer 20 (including an opening C4 in a region corresponding to or overlying the opening C1 in the second insulation layer 16) may be on edges, e.g., both edges, of the pixel electrode 120.

The opening C1 of the second insulation layer 16 may be wider than the opening C4 of the pixel defining layer 20. The etching surface of the via insulation layer 19 may be between the opening C1 of the second insulation layer 16 and the opening C4 of the pixel defining layer 20.

The via insulation layer 19 may include the contact hole C2 for electrically connecting the pixel electrode 120 to one of the source and drain electrodes 217a and 217b.

For example, a first contact layer 217c that is electrically connected to the drain electrode 217b, and a second contact layer 218 that is on the first contact layer 217c, may be under the contact hole C2. The pixel electrode 120 within the contact hole C2 may be directly connected to the second contact layer 218 and thus may be electrically connected to the drain electrode 217b.

The buffer layer 11 may be on the substrate 10 in the capacitor region CAP1. A capacitor including a first electrode 312 on a same layer as (e.g., coplanar with) the active layer 212, a second electrode 314 on same layer as (e.g., coplanar with) the gate electrode 215, and a third electrode 317 on same layer as (e.g., coplanar with) the source and drain electrodes 217a and 217b may be on the buffer layer 11.

The first electrode 312 of the capacitor may be formed of or may include a semiconductor doped with ion impurities, like the source and drain regions 212a and 212b of the active layer 212.

The second electrode 314 of the capacitor may be different in material, even though the second electrode 314 may be on the first insulation layer 13, like the gate electrode 215. The second electrode 314 may be formed of or may include a transparent conductive oxide. Ion impurities may be doped into the first electrode 312 through the transparent second electrode 314, and the capacitor according to the current embodiment may have a metal-insulator-metal (MIM) structure.

The third electrode 317 of the capacitor may be formed of or may include the same material as the source and drain electrodes 217a and 217b. The first, second, and third electrodes 312, 314, and 317 of the capacitor may constitute a plurality of capacitors that are connected to each other in parallel. Thus, the organic light-emitting display apparatus 3 may increase in capacitance without increasing area of the capacitor. Thus, the capacitor may have a decreased area, and an opening ratio may increase.

A first pad layer 417 on the same layer as (e.g., coplanar with) the source and drain electrodes 217a and 217b, and a second pad layer 418 on the first pad layer 417, may be on the second insulation layer 16 in the pad region PAD1.

The first pad layer 417 may include a plurality of metal layers having electron mobilities that different from each other, like the source and drain electrodes 217a and 217b. For example, the first pad layer 417 may be formed of or may include aluminum (Al), platinum (Pt), palladium (Pd), silver (Ag), gold (Au), nickel (Ni), neodymium (Nd), iridium (Ir), chromium (Cr), lithium (Li), molybdenum (Mo), titanium (Ti), tungsten (W), and copper (Cu), in a multilayer configuration.

The second pad layer 418 may be formed of or may include a transparent conductive oxide. Thus, the second pad layer 418 may help prevent the first pad layer 417 from being exposed to moisture and oxygen to help prevent a deterioration in reliability of the pad. The second pad layer 418 may be formed of or may include the same material as the second contact layer 218 that is under the contact hole C2 and the transparent protection layer 118 that is in the pixel region PXL1.

The second pad layer 418 (e.g., a protection layer) may be on the first pad layer 417, and the first pad layer 417 may not be exposed to an etchant while the pixel electrode 120 is etched.

Furthermore, an end of the first pad layer 417 (that is sensitive to external environments such as moisture or oxygen) may be covered by the via insulation layer 19, and the end of the first pad layer 417 may not be exposed to the etchant while the pixel electrode 120 is etched.

Although not shown in FIG. 3, in an implementation, the organic light-emitting display apparatus 3 according to the current embodiment may further include an encapsulation member (not shown) for sealing a display region that includes the pixel region PXL1, the transistor region TR1, and the capacitor region CAP1. The encapsulation member may be provided as an encapsulation thin film in which an organic insulation layer and inorganic insulation layer are alternately disposed, a substrate containing a glass material, or a metal film.

Figure 4:
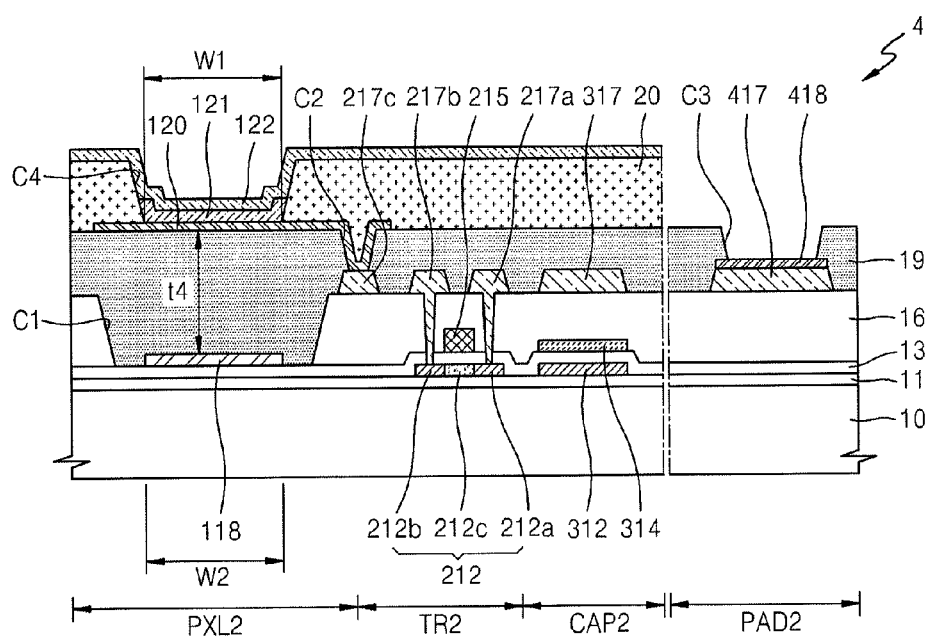
FIG. 4 illustrates a schematic cross-sectional view of an organic light-emitting display apparatus according to another embodiment.

FIG. 4 illustrates a schematic cross-sectional view of an organic light-emitting display apparatus according to another embodiment.

Referring to FIG. 4, an organic light-emitting display apparatus 4 according to the current embodiment may include a pixel region PXL2 that includes an intermediate layer 121 (including an organic emission layer) on a substrate 10, a transistor region TR2 that includes at least one thin film transistor, a capacitor region CAP2 that includes at least one capacitor, and a pad region PAD2.

The transistor region TR2, the capacitor region CAP2, and the pad region PAD2 may be the same as those of the organic light-emitting display apparatus 3 of FIG. 3, and only the pixel region PXL2 will be described below.

The organic light-emitting display apparatus 4 may include a transparent protection layer 118 on a substrate 10, a via insulation layer 19 on the transparent protection layer 118, a pixel electrode 120 on the via insulation layer 19, an intermediate layer 121 (including an organic emission layer) on the pixel electrode 120 and, and an opposite electrode 122 on the intermediate layer 121.

A pixel defining layer 20 covering edges, e.g., both edges, of the pixel electrode 120 may be on the via insulation layer 19. A buffer layer 11 and a first insulation layer 13 may be between the substrate 10 and the pixel electrode 120.

The pixel electrode 120 may include a transflective metal layer including, e.g., silver (Ag) or a silver alloy. The transparent protection layer 118 may include a transparent conductive oxide, and the via insulation layer 19 may include an organic material.

The transparent protection layer 118 and the via insulation layer 19 may help reduce and/or prevent an occurrence of dark spots in the organic light-emitting display apparatus 4.

The transparent protection layer 118 may have a width W2 that is equal to or greater than a width W1 of a region of the pixel electrode 120 that is exposed by the pixel defining layer 20, e.g., a region of the pixel electrode 120 that the pixel defining layer 20 does not overlie.

Unlike the organic light-emitting display apparatus of FIG. 3, the via insulation layer 19 may not include a region having a different height, i.e., an etching surface.

The via insulation layer 19 may have a thickness t4 of about 6 μm or less. Maintaining the thickness t4 of the via insulation layer 19 at about 6 μm or less may help ensure that light emitted from the intermediate layer 121 in a direction of the substrate 10 is not lost, thereby helping to prevent a reduction in optical efficiency.

The via insulation layer 19 may include a contact hole C2 that electrically connects the pixel electrode 120 to the source electrode 217a or the drain electrode 217b of the thin film transistor. A first contact layer 217c (electrically connected to the drain electrode 217b) may be under the contact hole C2, a portion of the pixel electrode 120 may be within the contact hole C2, and the pixel electrode 120 and the first contact layer 217c may be directly connected to each other.

For example, the organic light-emitting display apparatus 4 according to the current embodiment may not include the second contact layer 218 of the organic light-emitting display apparatus 3 of FIG. 3.

FIGS. 5 to 14 illustrate cross-sectional views of stages in a method for manufacturing the organic light-emitting display apparatus of FIG. 3.

Figure 5:
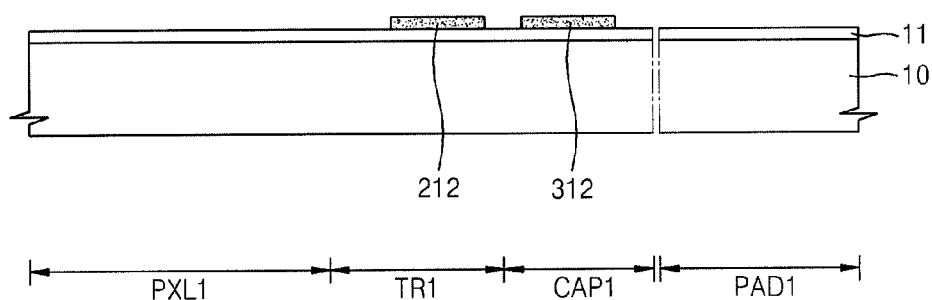
FIGS. 5 to 14 illustrate cross-sectional views of stages in a method for manufacturing the organic light-emitting display apparatus of FIG. 3.

Referring to FIG. 5, a buffer layer 11 may be formed on a substrate 10, and a semiconductor layer (not shown) may be formed on the buffer layer 11. Then, the semiconductor layer (not shown) may be patterned to form an active layer 212 of a thin film transistor and a first electrode 312 of a capacitor.

Although not shown in FIG. 5, a photoresist (not shown) may be applied on the semiconductor layer (not shown), and then the semiconductor layer (not shown) may be patterned through a photolithograph process using a photomask (not shown) to form the above-described active layer 212 and the first electrode 312. The process may be performed through a series of processes, e.g., a developing process, an etching process, and a stripping process or ashing process after an exposure process using an exposure device (not shown) is performed by using the photomask (not shown).

Figure 6:
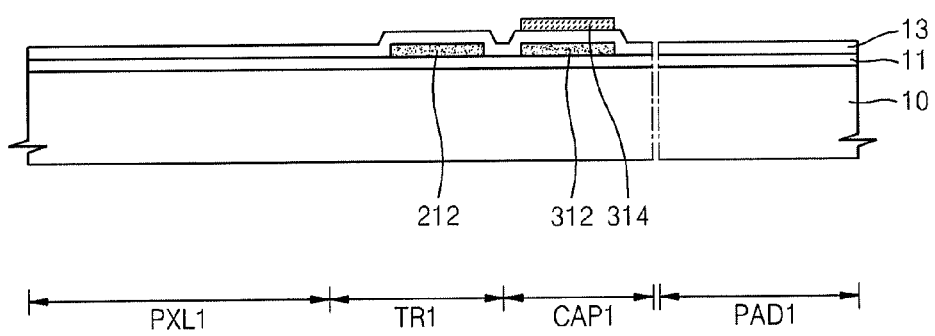

Referring to FIG. 6, a first insulation layer 13 may be formed on the buffer layer 11 to cover the active layer 212 and the first electrode 312. Then, a second electrode 314 of the capacitor may be formed on the first insulation layer 13 in a capacitor region CAP1. The second electrode 314 may include a transparent conductive oxide.

Figure 7:
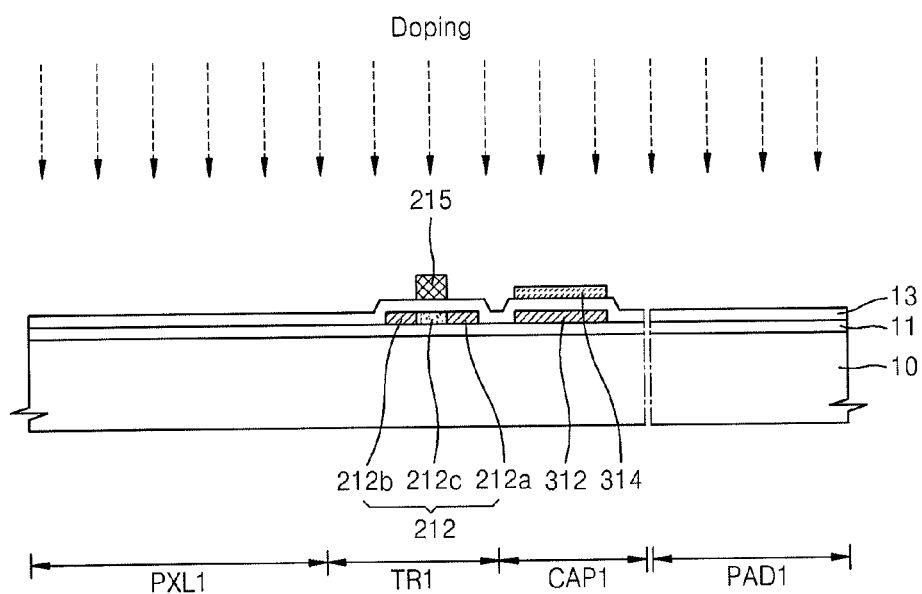

Referring to FIG. 7, a first metal layer (not shown) may be stacked on the first insulation layer 13 and then may be patterned to form a gate electrode 215 of the thin film transistor. For example, the first electrode 314 and the gate electrode 215 may be formed of materials different from each other through processes different from each other.

After the gate electrode 215 is formed, ion impurities may be doped into the active layer 212 by using the gate electrode 215 as a mask to form a channel region 212c (e.g., a region corresponding to or underlying the gate electrode 215) and source and drain regions 212a and 212b (in which the ion impurities are doped). In an implementation, the ion impurities may also be doped into the first electrode 213 of the capacitor.

Figure 8:
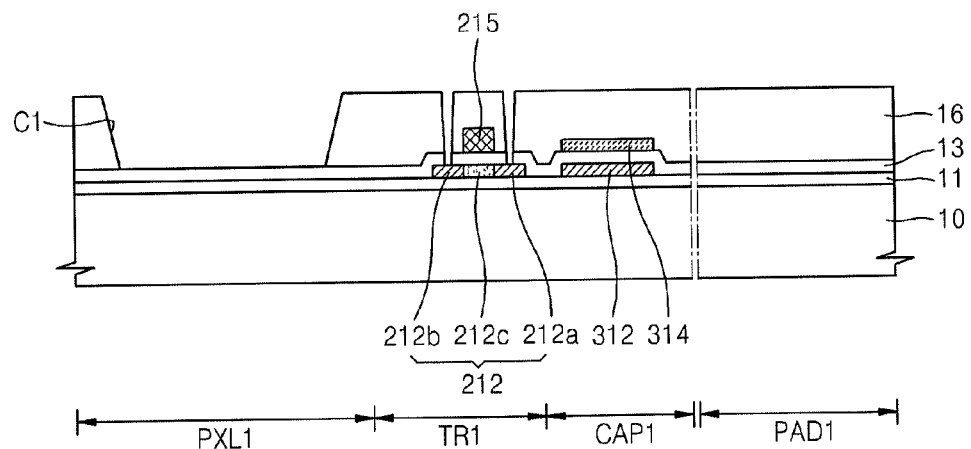

Referring to FIG. 8, a second insulation layer 16 may be formed on the first insulation layer 13 to cover the gate electrode 215 and the second electrode 314. Then, the second insulation layer 16 may be patterned to form an opening C1 (for exposing a portion of the first insulation layer 13 in a pixel region PXL1) and another opening (for exposing the source and drain regions 212a and 212b of the active layer 212).

Figure 9:
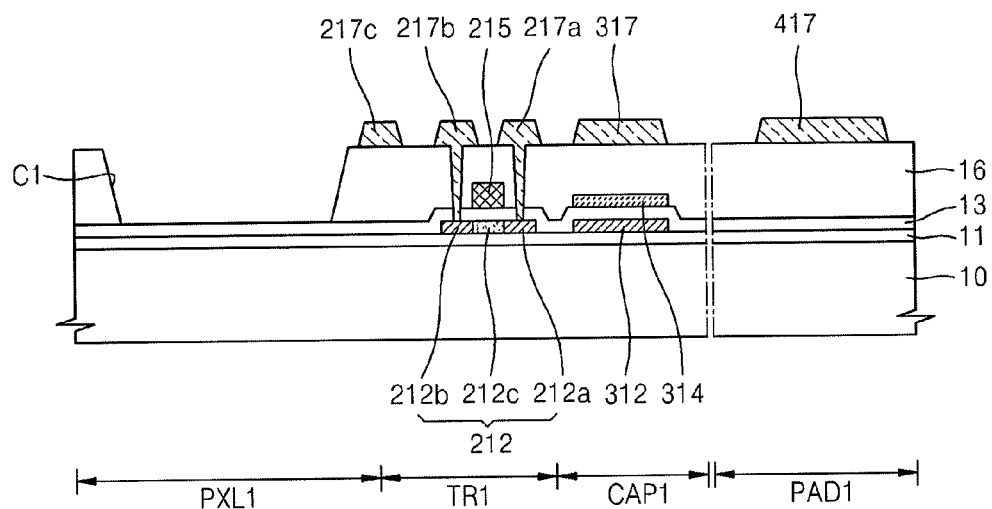

Referring to FIG. 9, a second metal layer (not shown) may be formed on the second insulation layer 16. Then, the second metal layer (not shown) may be patterned to form a source electrode 217a, a drain electrode 217b, a third electrode 317 of the capacitor, and a first pad layer 417 of a pad electrode.

Figure 10:
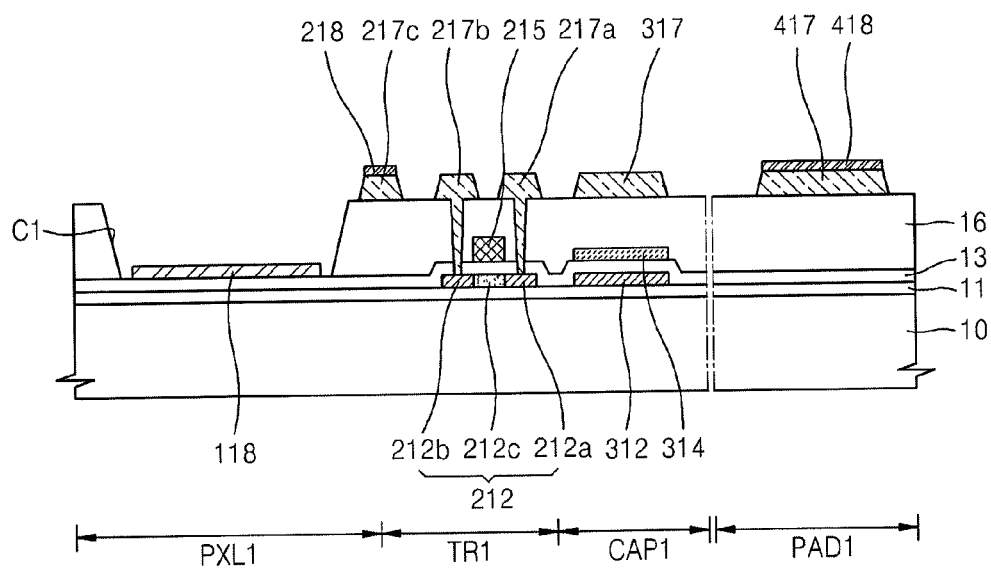

Referring to FIG. 10, a transparent conductive oxide layer (not shown) may be formed on the second insulation layer 16 to cover the source electrode 217a, the drain electrode 217b, the first contact layer 217c, the third electrode 317, and the first pad layer 417. Then, the transparent conductive oxide layer (not shown) may be patterned to form a transparent protection layer 118 in the pixel region PXL1, a second contact layer 218 on the first contact layer 217c, and a second pad layer 418 on the first pad layer 417.

Figure 11:
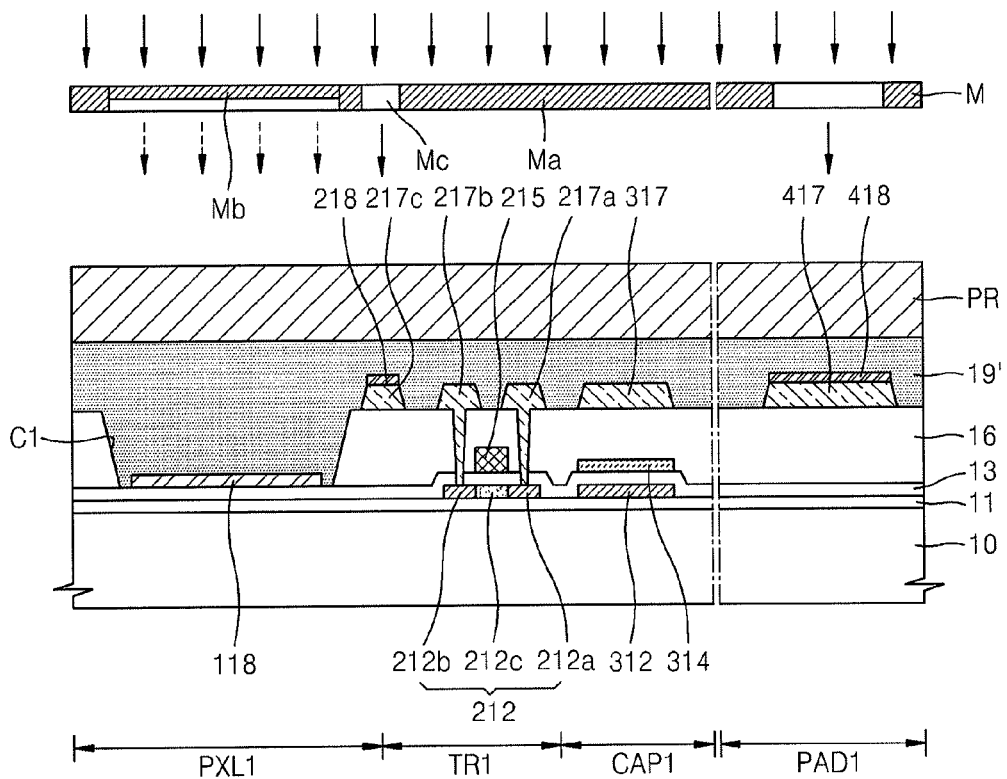
Figure 12:
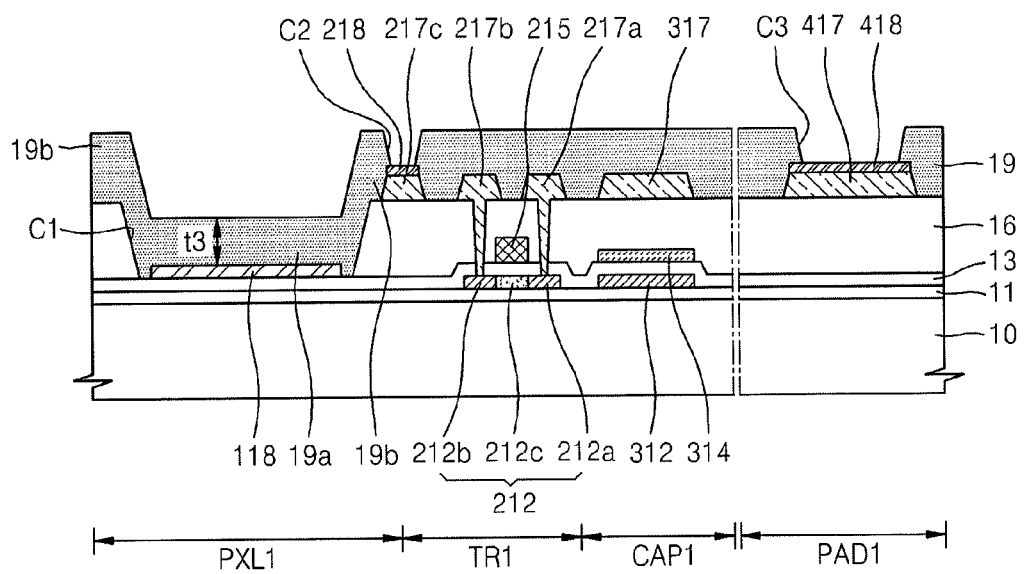

Referring to FIGS. 11 and 12, an organic material layer 19' and a photoresist PR may be formed on the second insulation layer 16 to cover the transparent protection layer 118, the second contact layer 218, the source electrode 217b, the third electrode 317, and the second pad layer 418. Then, the organic material layer 19' may be patterned by using a halftone mask M to form a via insulation layer 19.

The mask M may include a first region Ma for blocking light, a second region Mb for transmitting only a portion of the light, and a third region Mc for transmitting the light.

In an implementation, the positive type photoresist PR of which a region irradiated by light is etched may be provided in the current embodiment. In an implementation, a negative type photoresist of which a region that is not irradiated by light is etched may be provided. In this case, the region Ma for blocking the light and the region Mc for transmitting the light in the mask may be reversed.

The via insulation layer 19 may include a contact hole C2 for exposing the second contact layer 218 and an opening C3 for exposing the second pad layer 418.

The via insulation layer 19 in the pixel region PXL1 may include a first region 19a corresponding to or underlying a central portion of a pixel electrode 120 that will be described below, and a second region 19b corresponding to or underlying edges, e.g., both edges, of the pixel electrode 120. In an implementation, the first region 19a may have a thickness t3 of about 6 μm or less.

For example, in the current embodiment, a region corresponding to the pixel region PXL1 of the via insulation layer 19 may correspond to or be aligned with the region Mb in which only a portion of light is transmitted. Thus, only a portion of the via insulation layer 19 may remain on the transparent protection layer 118. For example, portions of via insulation layer 19 that remain may have a thickness that is adjustable according to an intensity and time of the irradiated light.

As described above, the via insulation layer 19 may help reduce the likelihood of and/or prevent dark spot from occurring in the organic light-emitting display apparatus 3.

Figure 13:
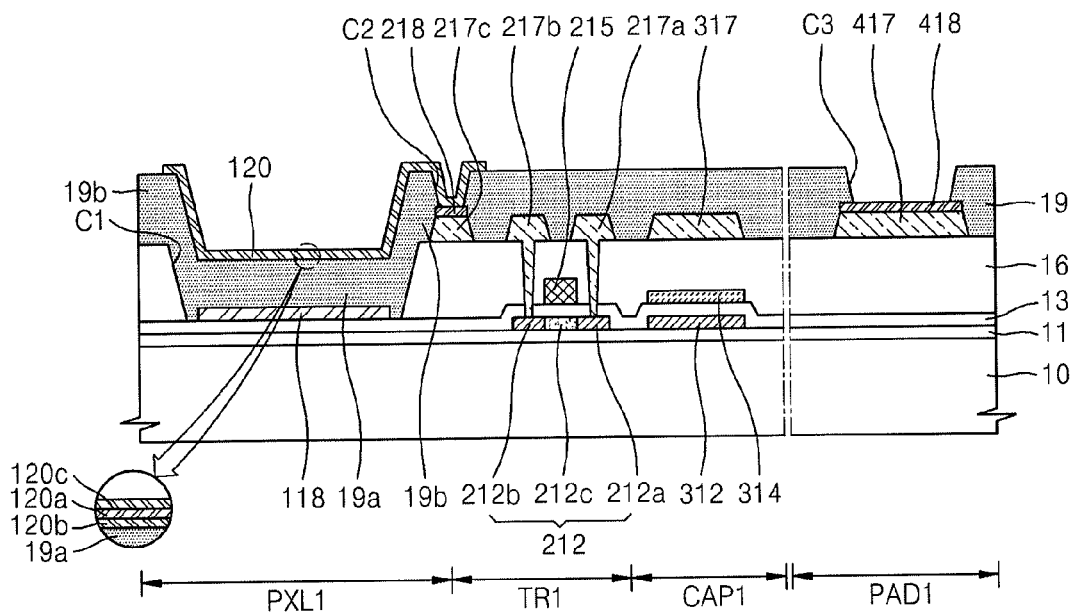

Referring to FIG. 13, the pixel electrode 120 may be formed on the via insulation layer 19 in the pixel region PXL1. The pixel electrode 120 may include a transflective metal layer 120a including, e.g., silver (Ag) or a silver alloy, and transparent electrodes 120b and 120c may be on upper and lower portion of the transflective metal layer 120a.

The pixel electrode 120 may be directly connected to the second contact layer 218 through the contact hole C2 formed in the via insulation layer 19.

Figure 14:
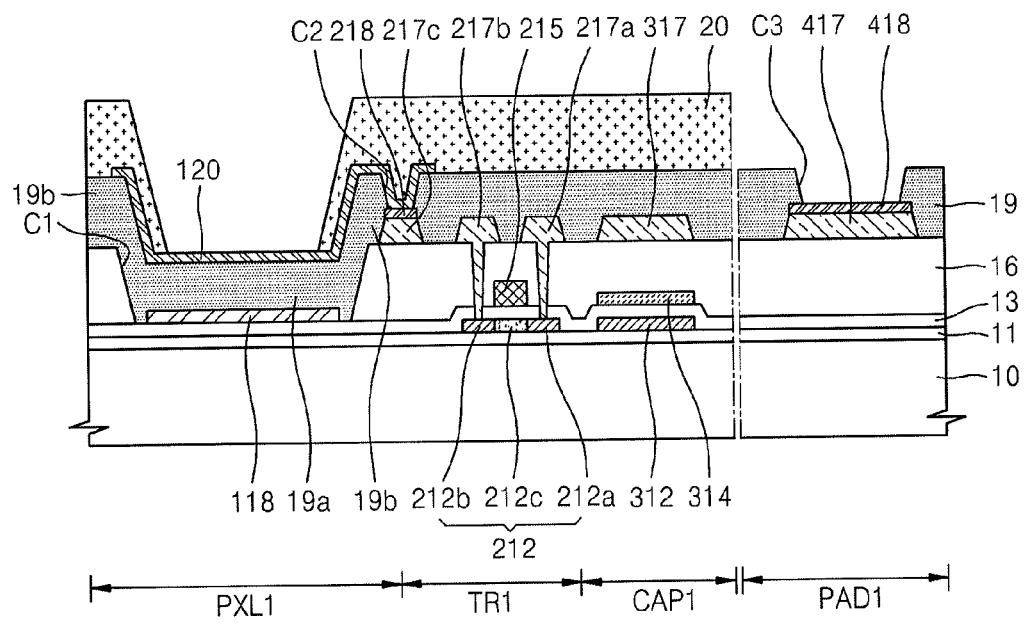

Referring to FIG. 14, a pixel defining layer 20 may be formed on the via insulation layer 19 to cover the pixel electrode 120. Then, the pixel defining layer 20 may be patterned to form an opening C4 exposing a central portion of the pixel electrode 120.

Although not shown, an intermediate layer (see reference numeral 121 of FIG. 3) including an organic emission layer and an opposite electrode (see reference numeral 122 of FIG. 3) may be formed on the pixel electrode 120.

An embodiment may include an organic light-emitting display apparatus and a method for manufacturing the same, in which the occurrence of undesirable dark spots may be reduced and/or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a transparent protection layer on a substrate, the transparent protective layer including a transparent conductive oxide;
   a via insulation layer on the transparent protection layer;
   a pixel electrode on the via insulation layer;
   an opposite electrode on the pixel electrode; and
   an intermediate layer between the pixel electrode and the opposite electrode, the intermediate layer including an organic emission layer.

2. The organic light-emitting display apparatus as claimed in claim 1, further comprising a pixel defining layer covering edges of the pixel electrode.

3. The organic light-emitting display apparatus as claimed in claim 2, wherein the transparent protection layer has a width that is equal to or greater than a width of a region of the pixel electrode that is exposed by the pixel defining layer.

4. An organic light-emitting display apparatus, comprising:
   a transparent protective layer on a substrate;
   a via insulation layer on the transparent protection layer;
   a pixel electrode on the via insulation layer;
   an opposite electrode on the pixel electrode; and
   an intermediate layer between the pixel electrode and the opposite electrode, the intermediate layer including and organic emission layer,
   wherein:
   the via insulation layer includes a first region underlying a central portion of the pixel electrode and a second region underlying edges of the pixel electrode, and
   a distance between the substrate and a top surface of the first region is less than a distance between the substrate and a top surface of the second region.

5. The organic light-emitting display apparatus as claimed in claim 4, wherein the first region of the via insulation layer has a thickness of about 6 μm or less.

6. The organic light-emitting display apparatus as claimed in claim 1, wherein the via insulation layer includes an organic material.

7. The organic light-emitting display apparatus as claimed in claim 1, wherein the transparent conductive oxide includes at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

8. The organic light-emitting display apparatus as claimed in claim 1, wherein:
   the pixel electrode includes a transflective metal layer, the transflective metal layer including silver or a silver alloy, and
   the opposite electrode includes a reflective metal layer.

9. The organic light-emitting display apparatus as claimed in claim 1, further comprising:
   a thin film transistor that is electrically connected to the pixel electrode, the thin film transistor including:
      an active layer,
      a gate electrode,
      source and drain electrodes,
      a first insulation layer between the active layer and the gate electrode, and
      a second insulation layer between the gate electrode and the source and drain electrodes; and
   a pad electrode, the pad electrode including:
      a first pad layer on a same layer as the source and drain electrodes, and
      a second pad layer on the first pad layer,
   wherein the via insulation layer covers the source and drain electrodes and edges of the pad electrode.

10. The organic light-emitting display apparatus as claimed in claim 9, wherein the transparent protection layer is on the first insulation layer.

11. The organic light-emitting display apparatus as claimed in claim 9, wherein the transparent protection layer is formed of a same material as the second pad layer.

12. The organic light-emitting display apparatus as claimed in claim 11, wherein the transparent protection layer has a thickness of about 200 Å to about 800 Å.

13. The organic light-emitting display apparatus as claimed in claim 9, further comprising a capacitor, the capacitor including:

a first electrode on a same layer as the active layer,
a second electrode on a same layer as the gate electrode, and
a third electrode on a same layer as the source and drain electrodes.

14. The organic light-emitting display apparatus as claimed in claim 9, wherein:
the via insulation layer includes a contact hole through which the pixel electrode is electrically connected to one of the source electrode and the drain electrode,
the organic light-emitting display apparatus further includes:
a first contact layer under the contact hole, the first contact layer being electrically connected to one of the source electrode and the drain electrode, and
a second contact layer on the first contact layer, the second contact layer including a same material as the second pad layer,
a portion of the pixel electrode is within the contact hole, and
the pixel electrode and the second contact layer are directly connected to each other.

15. A method for manufacturing an organic light-emitting display apparatus, the method comprising:
forming a transparent protection layer on a substrate such that the transparent protective layer includes a transparent conductive oxide;
forming a via insulation layer on the transparent protection layer;
forming a pixel electrode on the via insulation layer;
forming an intermediate layer on the pixel electrode such that the intermediate layer includes an organic emission layer; and
forming an opposite electrode on the intermediate layer.

16. The method as claimed in claim 15, further comprising forming a pixel defining layer that covers edges of the pixel electrode, after forming the pixel electrode.

17. The method as claimed in claim 15, wherein forming the via insulation layer includes patterning an organic material by using a halftone mask after the organic material is formed on the transparent protection layer such that the via insulation layer includes a first region underlying a central portion of the pixel electrode and a second region underlying edges of the pixel electrode.

18. The method as claimed in claim 17, wherein forming the via insulation layer includes forming the via insulation layer such that the first region has a thickness of about 6 μm or less.

19. The method as claimed in claim 15, further comprising:
forming and patterning a semiconductor layer on the substrate to form an active layer of a thin film transistor and a first electrode of a capacitor;
successively forming a first insulation layer and a transparent conductive oxide layer and patterning the transparent conductive oxide layer to form a second electrode of the capacitor;
forming and patterning a first metal layer to form a gate electrode of the thinfilm transistor;
forming a second insulation layer on the first insulating layer;
forming an opening in the second insulating layer and the first insulating layer such that the opening exposes a portion of the active layer;
forming and patterning a second metal layer to form source and drain electrodes of the thin film transistor, a third electrode of the capacitor, and a first pad layer of a pad electrode; and
forming and patterning a transparent conductive oxide layer to form a second pad layer on the first pad layer,
wherein:
forming the transparent protection layer includes forming the transparent protection layer on the first insulation layer exposed by the opening, and
forming the via insulation layer includes covering the source electrode, the drain electrode, the transparent protection layer, and edges of the second pad layer.

20. The method as claimed in claim 19, wherein forming the transparent protection layer is performed by a same process as the forming of the second pad layer.

* * * * *